(12) United States Patent
Gadamsetty

(10) Patent No.: US 11,551,779 B2
(45) Date of Patent: Jan. 10, 2023

(54) GLOBAL REDUNDANT COLUMN SELECT IMPLEMENTATION FOR BOUNDARY FAULTS IN A MEMORY DEVICE

(71) Applicant: Micron Technology, Inc., Boise, ID (US)

(72) Inventor: Harish V. Gadamsetty, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 17/240,389

(22) Filed: Apr. 26, 2021

(65) Prior Publication Data

US 2022/0343993 A1 Oct. 27, 2022

(51) Int. Cl.
*G11C 29/44* (2006.01)
*G11C 29/00* (2006.01)
*H03K 19/20* (2006.01)
*H03K 19/173* (2006.01)
*G11C 11/4091* (2006.01)

(52) U.S. Cl.
CPC ...... *G11C 29/4401* (2013.01); *G11C 11/4091* (2013.01); *G11C 29/785* (2013.01); *H03K 19/1737* (2013.01); *H03K 19/20* (2013.01)

(58) Field of Classification Search
CPC ............ G11C 29/4401; G11C 11/4091; G11C 29/785; H03K 19/1737; H03K 19/20
USPC ...................................................... 365/185.09
See application file for complete search history.

(56) References Cited

U.S. PATENT DOCUMENTS 9,287,004 B2 3/2016 Kim et al.
2013/0117602 A1* 5/2013 Kim ....................... G11C 29/04
711/147

* cited by examiner

*Primary Examiner* — Fernando Hidalgo
(74) *Attorney, Agent, or Firm* — Fletcher Yoder, P.C.

(57) ABSTRACT

An electronic device includes memory banks and repair circuitry configured to remap data from the memory banks to repair memory elements of the memory banks when a failure occurs. The repair circuitry includes a logic gate configured to receive an output from a memory bank of the memory banks, receive a failure signal indicating whether a corresponding memory element has failed, and transmit the output with a value of the output is based at least in part on the failure signal. The repair circuitry also includes error correction circuitry configured to receive the output via the logic gate and a multiplexer configured to receive the output from the memory bank, receive a repair value, and selectively output the output or the repair value from the repair circuitry as an output of the repair circuitry.

19 Claims, 6 Drawing Sheets

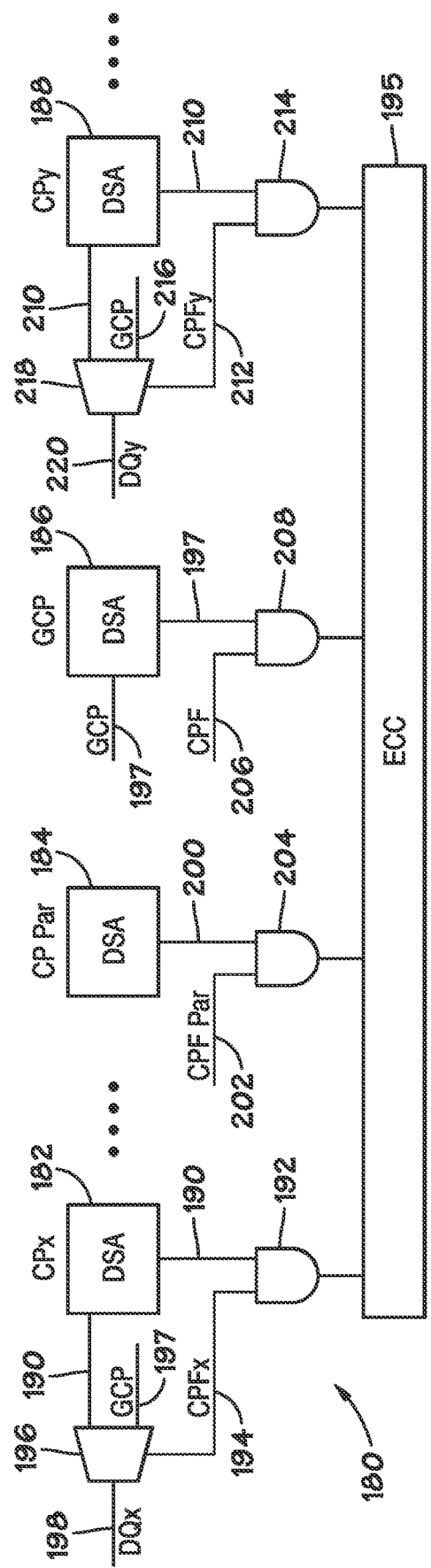
FIG. 6
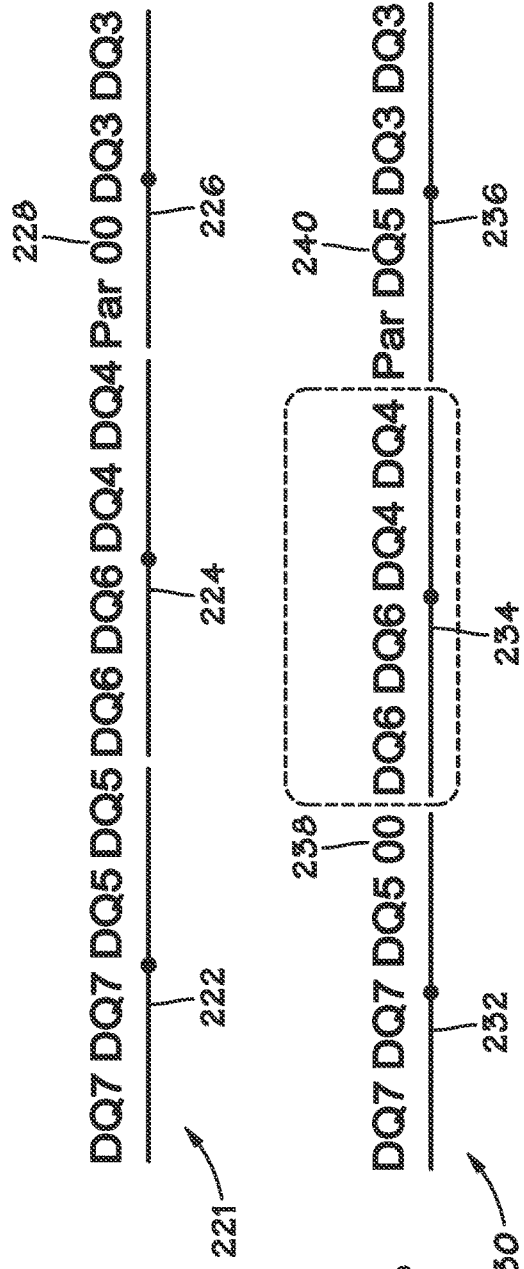
FIG. 7
FIG. 8

GLOBAL REDUNDANT COLUMN SELECT IMPLEMENTATION FOR BOUNDARY FAULTS IN A MEMORY DEVICE

BACKGROUND

Field of the Present Disclosure

Embodiments of the present disclosure relate generally to the field of memory devices. More specifically, embodiments of the present disclosure relate to global redundant column select implementations for boundary faults in a memory device.

Description of Related Art

Memory devices become increasingly complicated with multiple possible failures in the semiconductor manufacture of the memory devices. To mitigate these potential failures, the memory devices may be implemented with redundant memory elements that may be utilized when other memory elements have failed. The defective memory elements are disabled, and the redundant memory elements are activated. Memory accesses are then remapped from the defective memory elements to other memory elements. In some situations, the remapping may map the defective memory elements to the redundant memory elements. However, in other situations, multiple memory elements may be remapped with the defective memory elements remapped to an intermediate memory element with the (or another) intermediate memory element being remapped to the redundant memory elements. The remapping may be performed using a local redundant column select (LRCS) implementation with the column planes (CPs) of memory elements having a number (e.g., 2, 3, 4, or more) of redundant columns to perform repairs within the CP. Additionally or alternatively, a global redundant column select (GRCS) implementation in a memory device includes a global column plane that may be used in place of a faulty column select of a column plane. In some embodiments, a GRCS implementation may have a better yield and smaller die size than some LRCS implementations.

However, GRCS implementations may utilize data multiplexing that may delay error correction code (ECC) processing. Furthermore, GRCS implementations may be constrained by ECC specifications. For instance, a boundary fault specification of the memory device may specify how many bits on a die may be corrected (e.g., 1 bit) and how many bits on a system level may be corrected (e.g., multiple bits). As such, the specification may indicate that a first number (e.g., 1) of data lines (DQ) for all burst bits and a second number (e.g., 2) of DQs for half of burst bits are correctable. Furthermore, the specification may indicate where the bit errors are permissible. For instance, the specification may indicate that all data fails are to be within a single DQ or only in two DQs for half bursts. Furthermore, the specification for the memory device may limit a number (e.g., 2) of DQs on a sub-word line (SWL). This limit may prevent safe usage of certain GRCS implementations that may possibly result in more than the number of DQs on the SWL.

Embodiments of the present disclosure may be directed to one or more of the problems set forth above.

BRIEF DESCRIPTION OF DRAWINGS

FIG. 6 is a circuit diagram of the repair circuitry of FIG. 1 using an alternative GRCS implementation, according to an embodiment of the present disclosure;

FIG. 7 is a representation of a portion of the DQs of FIG. 2 that is output from the repair circuitry of FIG. 6 when no repair is made, according to an embodiment of the present disclosure; and FIG. 8 is a representation of a portion of the DQs of FIG. 2 that is output from the repair circuitry of FIG. 6 when a repair is made, according to an embodiment of the present disclosure;

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Repair circuitry may be used to repair faulty column planes using a global column plane. The repair circuitry may receive outputs from data sense amplifiers (DSAs) and transmit the outputs (e.g., concurrently and/or in parallel) to both a multiplexer and a logic gate. The logic gate may be used to connect the outputs to error correction circuitry used to perform error correction code (ECC) evaluations and/or corrections. Data from column planes being repaired may not be used for actual data. Thus, the contents of such column planes do not need to be evaluated for bit errors in the error correction circuitry. Instead, the logic gate may be used to set the corresponding contents to a default value (e.g., zeroed out) based on a signal used to indicate whether the column plane has been repaired. The same signal may be used to control whether output of the DSA is output from the respective multiplexer as a data input-output (DQ). If the column plane is not repaired, the output is transmitted. If the column plane is repaired, data from a global column plane (GCP) may be output from the multiplexer instead of the output from the DSA. Furthermore, the GCP may be evaluated separately as transmitted from respective DSA(s) corresponding to the GCP. If the data in the GCP is to be used (e.g., any column plane is repaired), a GCP logic gate may transmit the repair value of the DSA to the error correction circuitry. If the data in the GCP is not to be used, the GCP logic gate may set the GCP to the default value.

Figure 1:
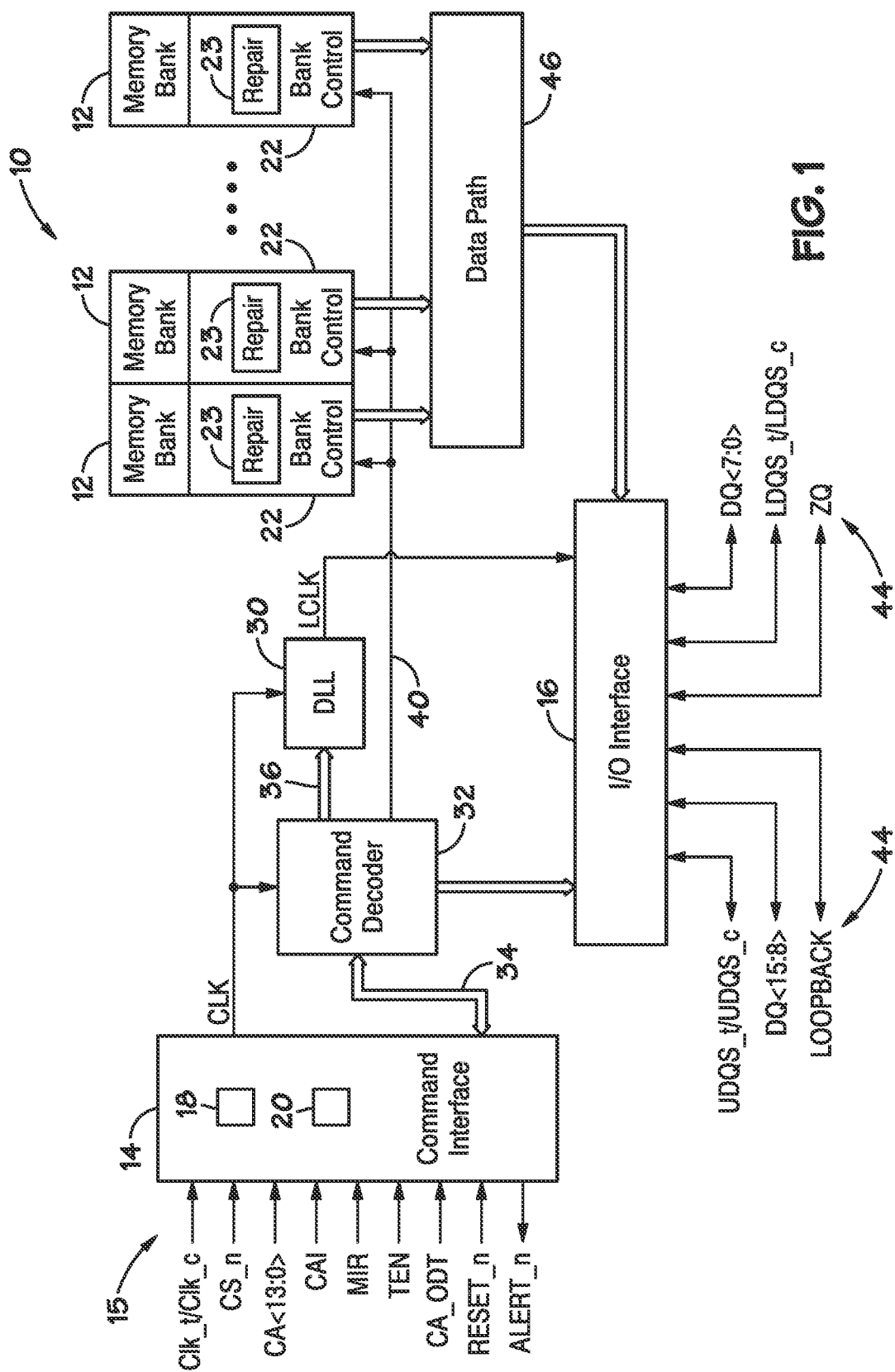
FIG. 1 is a simplified block diagram illustrating certain features of a memory device having repair circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×4, ×8, or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. For instance, the bank control block 22 may include repair circuitry 23 that may remap data in the memory banks 12 using redundant memory elements. For instance, the repair circuitry 23 may be used to implement local redundant column select (LRCS) repairs and/or global redundant column select (GRCS) repairs.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function.

The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals on DQ lines, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional DQ signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/Vss external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external Vdd and Vss signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
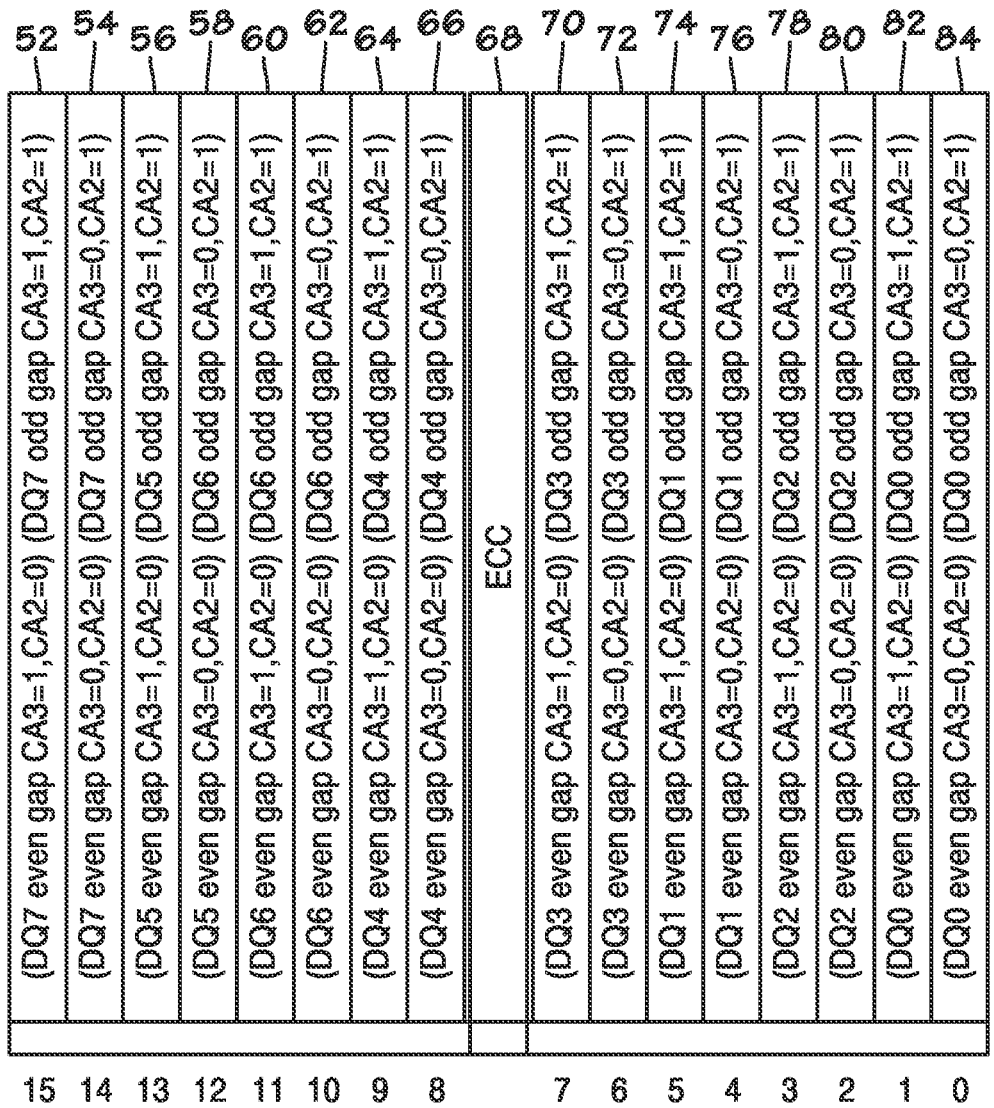
FIG. 2 is a map of data lines (DQs) for a memory bank of the memory device of FIG. 1, according to an embodiment of the present disclosure.

With the foregoing in mind, FIG. 2 is a map 50 of data lines (DQ) in an embodiment of a DDR5×8 DQ mapping for a memory bank 12. The map 50 is used for illustrative purposes, but other embodiments may include other mappings and/or different numbers of DQs per bank. As illustrated, the memory bank 12 includes column planes 52, 54, 56, 58, 60, 62, 64, 66, 68, 70, 72, 74, 76, 78, 80, 82, and 84, collectively referred to as column planes 52-84. Some embodiments may have different numbers of column planes per bank and/or per memory bank. Each of the column planes 52-84 is associated with a DQ for respective column addresses and even/odd sense amplifiers. For instance, the column planes 52 and 54 correspond to DQ7. The column planes 56 and 58 correspond to DQ5, the column planes 60 and 62 correspond to DQ6, the column planes 64 and 66 correspond to DQ4. The column plane 68 corresponds to error control code (ECC). The column planes 70 and 72 correspond to DQ3, the column planes 74 and 76 correspond to DQ1, the column planes 78 and 80 correspond to DQ2, and the column planes 82 and 84 correspond to DQ0.

Figure 3:
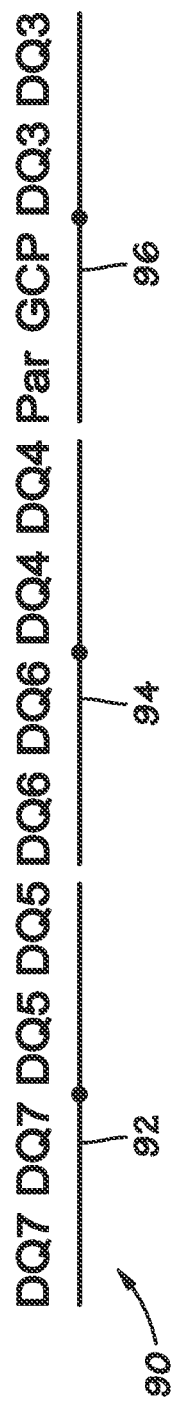
FIG. 3 is a representation of a portion of the DQs of FIG. 2 with a global column plane (GCP), according to an embodiment of the present disclosure.

FIG. 3 is a graphical representation 90 of sub-word lines (SWL) 92, 94, and 96 corresponding to respective DQs of FIG. 2. AS illustrated, the DQs may be strategically placed such that if an SWL fails, the boundary fault specification is still met. The graphical representation 90 shows the associations of the SWLs 92, 94, and 96 to the column planes 52, 54, 56, 58, 60, 62, 64, 66, 68, 70, and 72 when no repair is made to the column planes 52, 54, 56, 58, 60, 62, 64, 66, 68, 70, and 72. As illustrated, the SWL 92 corresponds to the DQ7 and the DQ5. For instance, the SWL 92 may be coupled to the column planes 52, 54, 56, and 58 of the map 50 of FIG. 2. Similarly, the SWL 94 corresponds to the DQ6 and DQ4. For instance, the SWL 94 may be coupled to the column planes 60, 62, 64, and 66 of the map 50 of FIG. 2. Additionally, the SWL 96 corresponds to parity bits (e.g., ECC), a global column plane (GCP), and DQ3. The SWL 96 may correspond to the parity bits and the GCP in embodiments where the specification for the memory device 10 does not specify that the ECC parity bits are to be isolated from the GCP and/or the DQs (e.g., DQ3). In some embodiments, at least some DQs (e.g., DQ7, DQ0, etc.) may have half-length SWLs for some WLs (e.g., even WLs).

Figure 4:
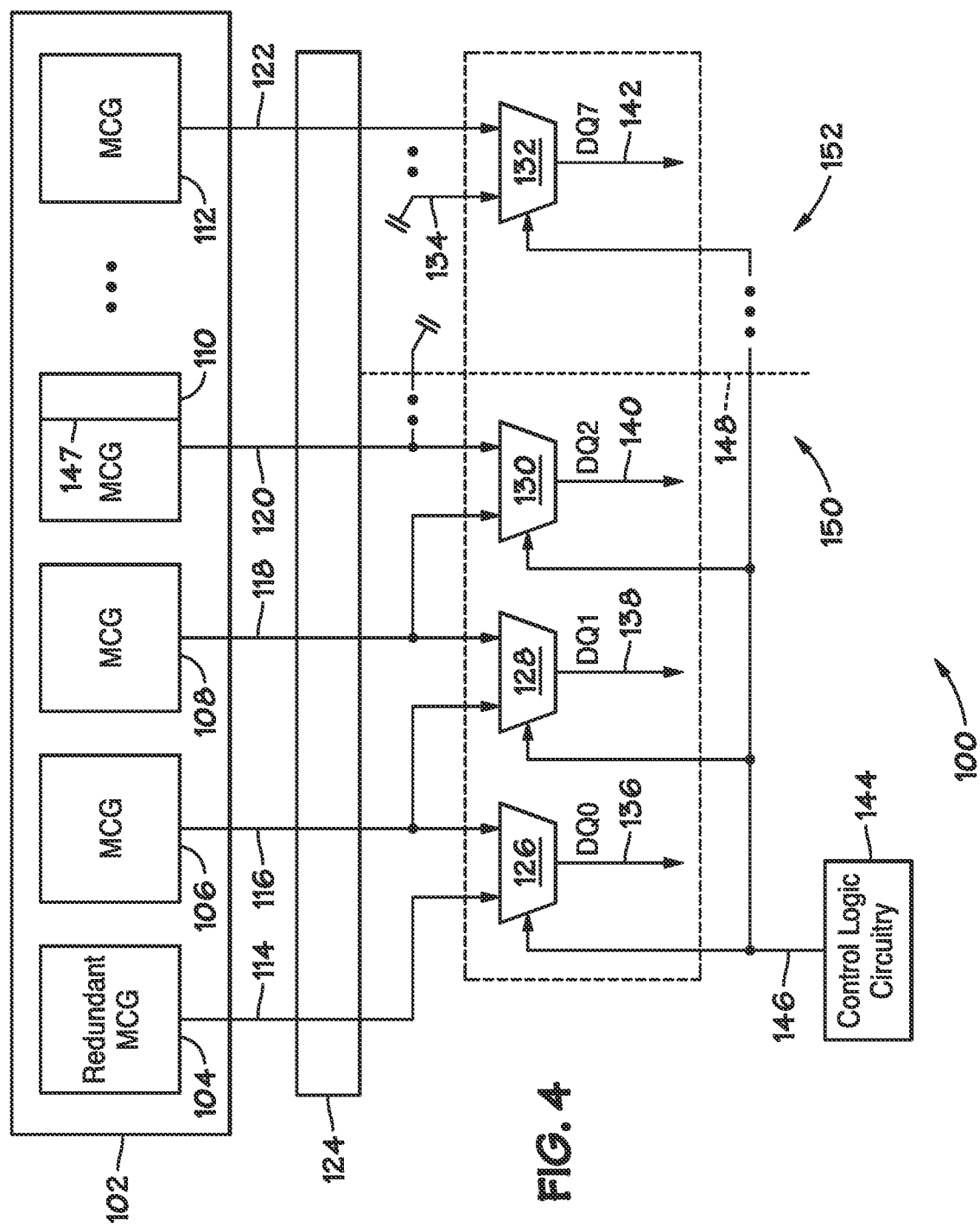
FIG. 4 is a shift-based GRCS implementation of the repair circuitry of FIG. 1 using the GCP, according to an embodiment of the present disclosure.

To perform repairs on the memory device 10, the repair circuitry 23 may be used to shift/remap data to perform the repair. FIG. 4 is a schematic diagram of repair circuitry 100 that is a shift-based implementation of the repair circuitry 23. The repair circuitry 100 is used to repair a memory bank 102 (e.g., memory bank 12) that includes a redundant memory cell group (MCG) 104 and MCGs 106, 108, 110, and 112. The redundant MCG 104 and the MCGs 106, 108, 110, and 112 may each have one or more corresponding column planes. The redundant MCG 104 and the MCGs 106, 108, 110, and 112 may output respective data 114, 116, 118, 120, and 122 to a data sense amplifier 124. The data sense amplifier 124 then transmits the data 116, 118, 120, and 122 to respective multiplexers 126, 128, 130, and 132. To accommodate column plane repairs, each multiplexer 126, 128, 130, and 132 may receive data 114 from the redundant MCG 104. Alternatively, as illustrated, data from multiple column planes may be shifted to reduce a distance in shifting and/or routing. In other words, each multiplexer 126, 128, 130, and 132 may be used to select between two different MCGs/column planes. For instance, the multiplexer 126 may receive the data 114 and the data 116, the multiplexer 128 may receive the data 116 and the data 118, the multiplexer 130 may receive the data 118 and 120, and the multiplexer 132 may receive the data 122 and a data 134 received from an MCG (not shown) that is adjacent to the MCG 112.

The selected inputs that may be output from each multiplexer 126, 128, 130, and 132 may be output as a respective DQ. For instance, the output of the multiplexer 126 may correspond to DQ0 136, the output of the multiplexer 128 may correspond to DQ1 138, the output of the multiplexer 130 may correspond to DQ2 140, and the output of the multiplexer 132 may correspond to DQ7 140.

Control logic circuitry 144 may be used to generate and/or output one or more control signals 146 to control the selection of inputs to the multiplexers 126, 128, 130, and 132. For instance, the shifting may be used to shift data for a repaired column plane 147 in the MCG 110. The control logic circuitry 144 may receive an indication of and/or determine a location of a data shifting boundary 148 corresponding to the repaired column plane 147. All read data from the left side of the data shifting boundary 148 in a shifting region 150 is shifted toward the left by one column plane length for multiplexing while data to the right of the data shifting boundary 148 are in a non-shifting region 152 that is not shifted. Thus, data in the DQ2 140 is shifted from the MCG 108 as the data 118 rather than the data 120 from MCG 110 or the data 114 from the redundant MCG 104 while the data in the DQ7 142 is transmitted from the MCG 112 as the data 122. Since the data 118 from the MCG 108 is transmitted as DQ2 140 due to the shift repair, the data 116 from the MCG 106 is transmitted as DQ1 138, and the data 114 from the redundant MCG 104 is transmitted as DQ0 136. Each of the DQs may then be transmitted to other circuitry, such as ECC circuitry and/or a host device. Accordingly, ECC evaluations wait until multiplexing has been performed before the DQs may be evaluated for bit errors. In other words, the repair circuitry 100 may delay the ECC computations.

Figure 5:
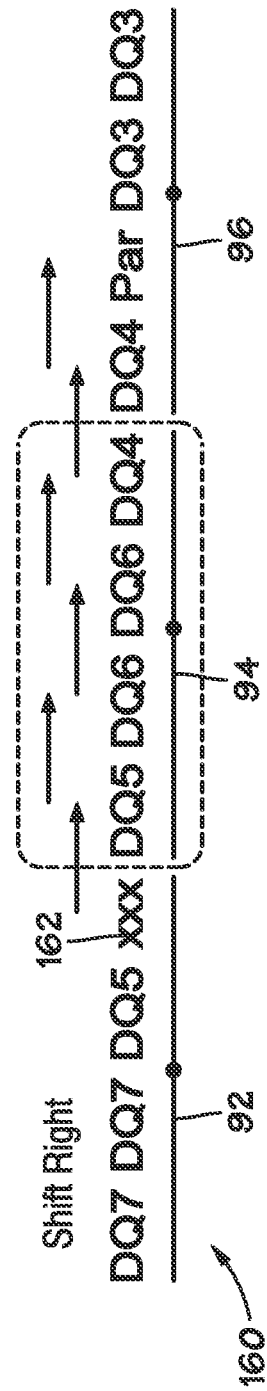
FIG. 5 is a representation of a portion of the DQs of FIG. 3 after a shift repair using the GCP, according to an embodiment of the present disclosure.

Although the shifting scheme of the repair circuitry 100 may be capable of repairing the repaired column plane 147 with shortened routing, the output of the repair circuitry 100 may conflict with the specification (e.g., ECC requirements) for the memory device 10. For example, FIG. 5 is a graphical representation 160 of sub-word lines (SWL) 92, 94, and 96 corresponding to respective DQs of FIG. 2 after a repair is made using the repair circuitry 100. In other words, the graphical representation 160 of FIG. 5 may show the SWLs 92, 94, and 96 after a repair to the column plane 58 is made to the corresponding representation 90 of FIG. 3. As illustrated, DQ5 corresponding to the column plane 58 is shifted from location 162 using the repair circuitry 100. Instead, that portion of DQ5 is shifted from the SWL 92 to the SWL 94. Similarly, the data corresponding to DQ6, DQ4, and the parity bits are also shifted until the parity bits are shifted into a space allocated to the GCP in the graphical representation 90 of FIG. 2. However, due to the shift, DQ6 and portions of DQ5 and DQ4 are on the SWL 94. This condition may be outside of the boundary fault specification for the memory device 10 (e.g., limits on permissible values due to ECC evaluations).

To remain in compliance with the specification for the memory device 10, repair circuitry 180 of FIG. 6 may be used as an alternative implementation of the repair circuitry 23 of FIG. 1. As illustrated, the repair circuitry 180 receives data from data sense amplifiers (DSAs) 182, 184, 186, and 188 that sense data stored in the memory blocks 12. Although only four DSAs are shown in the repair circuitry 180, embodiments of the repair circuitry 180 may have fewer or more DSAs. For instance, a DSA may be present for each bit in a column plane with the illustrated DSAs each corresponding to a respective column plane. Furthermore, each DSA to the left of the GCP and parity DSAs may correspond to column planes to the left of the column plane 68 while each DSA to the right of the GCP and parity DSAs may correspond to column planes to the right of the column plane 68. Moreover, there may be a number (e.g., 128) of DSAs for data bits and a second number (e.g., 8 bits) of DSAs for GCP bits. As such, each DSA may represent multiple DSAs and/or may output multiple bits to multiple logic gates. Moreover, a number of parity bits may vary according to ECC scheme.

Furthermore, each DSA has a respective output. For instance, DSA 182 has an output 190 that is output to an AND gate 192. The AND gate 192 also receives a column plane fault signal 194 that indicates whether a corresponding column plane has been repaired. For instance, if the column plane has been repaired, column plane fault signal 194 may be low thereby causing the AND gate 192 to zero out the output 190 before transmission to ECC circuitry 195 that evaluates data for bit errors. The output 190 is also transmitted from the DSA 182 to a multiplexer 196 to determine whether the output 190 or a global column plane (GCP) output 197 is transmitted as a DQ output 198 for the DSA 182. The DSA 182 is configured to transmit the output 190 to the multiplexer 196 and the AND gate 192 concurrently and/or in parallel. As discussed below in relation to FIG. 10, by sending the output 190 (or zeros) rather than waiting for multiplexer completion, the ECC computations on the output 190 may be performed more rapidly than multiplexing before ECC evaluations. If a repair has occurred, a more rapid replacement of the output 190 with zeros may be performed than using multiplexers between the DSA 182 and the ECC circuitry 195 since a simple repair signal may be ANDed with the output 190. This zeroing out is possible since the repair uses data from the GCP output 197 rather than using the data from the output 190. As illustrated, the GCP output 197 may be transmitted independently to the ECC circuitry 195 from the DSA 186. Accordingly, the zeroed out output 190 need not be replaced by the GCP output 197 for ECC evaluations. Instead, the output 190 may be set to a default value (e.g., all zeroes).

The DSA 184 outputs a parity output 200 that, along with a parity column plane fault signal 202, is transmitted to an AND gate 204. The parity column plane fault signal 202, like the column plane fault signal 194, may be used to zero out the parity output 200 prior to transmission to the ECC circuitry 195 for ECC evaluation if the column plane for the ECC is faulty and/or is optionally disable.

The DSA 186 outputs the GCP output 197 that is made available for usage to replace data for other outputs from other DSAs to repair a column plane. A column plane fault signal 206 indicates whether any column plane faults are to be repaired using the GCP output 197. In other words, if a repair is not in place, the GCP output 197 may go unused. In such situations, the GCP output 197 may be zeroed out using the column plane fault signal 206 via the AND gate 208 prior to transmission to the ECC circuitry 195. In other words, a repair logic gate (e.g., AND gate) may be used to zero out a repair value before the repair value is transmitted to the ECC circuitry 195 when no repair is to be used for the memory bank. However, when a repair is used, the GCP output 197 may be transmitted to the ECC circuitry 195 from the repair logic gate (e.g., AND gate 208) rather than from the location the included data is to be used since this replacement may be performed in a multiplexer at least partially in parallel with the ECC evaluations.

The DSA 188 functions similar to the DSA 182 except that the DSA 188 is associated with a different column plane to the right of the DSAs 184 and 186. Specifically, the DSA 188 may output an output 210. A respective column plane fault signal 212 indicates whether the column plane corresponding to the DSA 188 and the output 210 has been repaired to use the GCP output 197. If a repair has been performed, the data being used is transmitted to the ECC circuitry 195 as the GCP output 197. In such situations, the output 210 need not be checked for ECC evaluation. Accordingly, the output 210 may be zeroed out using the AND gate and the column plane fault signal 212. The output 210 is also transmitted to a multiplexer 218 that uses the column plane fault signal 212 to control whether the output 210 is output from the multiplexer 218 as a respective DQ 220. In some embodiments, repairs may be limited to only one column plane at a time.

Although the foregoing discusses zeroing out unused data before transmission to the ECC circuitry 195, some embodiments may utilize an alternative default value (e.g., 1) when the corresponding column plane has been repaired and the unrepaired output is not to be used in the ECC circuitry 195.

FIG. 7 is a graphical representation 221 of sub-word lines (SWL) 222, 224, and 226 corresponding to respective DQs of FIG. 2. The graphical representation 221 shows the associations of the SWLs 222, 224, and 226 to the column planes 52, 54, 56, 58, 60, 62, 64, 66, 68, 70, and 72 when no repair is made to the column planes 52, 54, 56, 58, 60, 62, 64, 66, 68, 70, and 72. As illustrated, the SWL 222 corresponds to the DQ7 and the DQ5. For instance, the SWL 222 may be coupled to the column planes 52, 54, 56, and 58 of the map 50 of FIG. 2. Similarly, the SWL 224 corresponds to the DQ6 and DQ4. For instance, the SWL 224 may be coupled to the column planes 60, 62, 64, and 66 of the map 50 of FIG. 2. Additionally, the SWL 226 corresponds to parity bits (e.g., ECC), a global column plane (GCP), and DQ3. The SWL 226 may correspond to the parity bits and the GCP in embodiments where the specification for the memory device 10 does not specify that the ECC parity bits are to be isolated from the GCP and/or the DQs (e.g., DQ3). Since no GCP output 197 is being used, it has been zeroed out using the repair circuitry 180 of FIG. 5 as indicated by the zeroes 228. Although a portion of the DQs are shown in FIG. 7, additional DQs and/or column planes in similar arrangements may be included in the memory device 10.

FIG. 8 is a graphical representation 230 of sub-word lines (SWL) 232, 234, and 236 corresponding to respective DQs of FIG. 2 as transmitted to the ECC circuitry 195. The graphical representation 221 shows the associations of the SWLs 232, 234, and 236 to the column planes 52, 54, 56, 58, 60, 62, 64, 66, 68, 70, and 72 when a repair is made to the column plane 58. As illustrated, the SWL 232 corresponds to the DQ7 and the DQ5. However, the column plane 58, previously associated with DQ5 as illustrated in FIG. 7, has been repaired. Accordingly, as illustrated, the output (e.g., output 190) corresponding to the column plane 58 is zeroed out using a respective AND gate (e.g., AND gate 192) using a respective column plane fault signal (e.g., column plane fault signal 194).

The SWL 234 corresponds to the DQ6 and DQ4. For instance, the SWL 234 may be coupled to the column planes 60, 62, 64, and 66 of the map 50 of FIG. 2. Additionally, the SWL 236 corresponds to parity bits (e.g., ECC), a GCP, and DQ3. However, since the repair has been made to the column plane 58, the redundant memory in the GCP is used to store data that would have been stored in column plane 58. Accordingly, the GCP at location 240 is transmitted to the ECC circuitry 195 containing data that is used as DQ5. Specifically, the GCP output (e.g., the GCP output 197) is used to replace the repaired output (e.g., the output 190) using a respective multiplexer (e.g., the multiplexer 196) as the corresponding parts of the DQ5. That portion of the DQ5 is evaluated in the ECC circuitry 195 in parallel to the multiplexing enabling the ECC circuitry 195 to be evaluated without waiting for the multiplexing to complete. Furthermore, although the portion of data from DQ5 is evaluated in the ECC circuitry 195, due to the presence of the parity bits and the GCP and DQ3, the SWLs will not carry too many (e.g., 3) different DQs. For example, SWL 232 carries only DQ7 and DQ5, SWL 234 carries only DQ6 and DQ4, and SWL 236 carries only DQ5 and DQ3. This repair result keeps the memory device 10 operating within the boundary fault specification.

Figure 9:
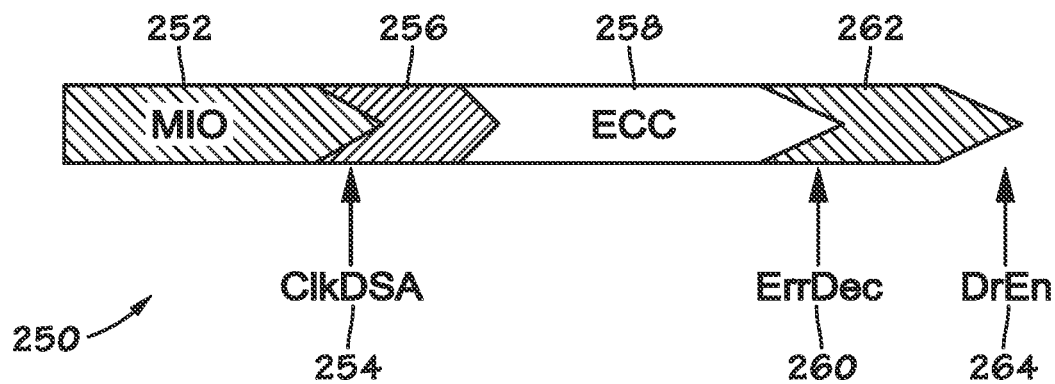
FIG. 9 is a flow diagram of a data read using the shift-based GRCS implementation of FIG. 4, according to an embodiment of the present disclosure.

Furthermore, as noted above, by removing multiplexing from the critical path to the ECC circuitry 195, evaluating the data using the ECC circuitry 195 may be performed more quickly. For instance, FIG. 9 is a flow diagram showing timing in a read process 250 using the repair circuitry 100 of FIG. 4. As illustrated, data is obtained from the DSAs via main IO (MIO) lines during MIO period 252. A pulse based on a data sense amplifier clock (ClkDSA) 254 may be used to determine that the outputs from the DSAs has been latched. During a multiplexer period 256, the multiplexers (e.g., the multiplexers 126, 128, 130, and 132) select which outputs are transmitted for ECC evaluation. After the multiplexers transmit the selected outputs, the ECC circuitry evaluates the transmitted outputs for parity errors in an ECC period 258. A pulse (e.g., ErrDec 260) may indicate that ECC computations has been completed and/or indications of whether bit errors have been detected/corrected. The verified (and/or corrected) data is loaded onto a drive bus during a load period 262 that drives the data out upon assertion of a drive enable signal 264 (e.g., DrEn signal).

Figure 10:
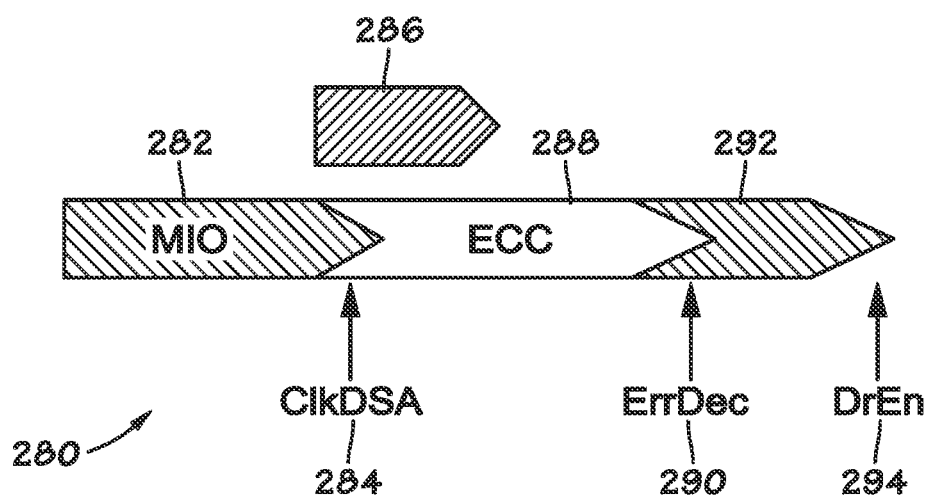
FIG. 10 is a flow diagram of a data read using the alternative GRCS implementation of FIG. 6, according to an embodiment of the present disclosure.

FIG. 10 is a flow diagram showing timing in a read process 280 using the repair circuitry 180 of FIG. 6. As illustrated, data is obtained from the DSAs via main 10 (MIO) lines during MIO period 282. A pulse based on a data sense amplifier clock (ClkDSA) 284 may be used to determine that the outputs from the DSAs has been latched. During a multiplexer period 286, the multiplexers (e.g., the multiplexers 196, 218) select which outputs are transmitted for transmissions as respective DQs. While the multiplexers transmit the selected outputs, ECC circuitry 195 evaluates outputs that are also transmitted to the multiplexers enabling the ECC circuitry 195 to evaluate outputs in an ECC period 288 without waiting for the multiplexers to complete selecting and transmitting outputs. In other words, the ECC period 288 may at least partially overlap the multiplexer period 286 enabling the ECC period 288 to begin sooner after initiation of the read process 280 than the ECC period 258 of FIG. 9. A pulse (e.g., ErrDec 290) may indicate that ECC computations has been completed and/or indications of whether parity bit errors have been detected. The verified (and/or corrected) data is loaded onto a drive bus during a load period 292 that drives the data out upon assertion of a drive enable signal 294. Since the ECC period 288 may begin closer to the initiation of the read process 280 than the ECC period 258 may begin relative to the initiation of the read process 250, the read process 280 may complete more quickly than the read process 250. Furthermore, the read process 280 may avoid associating too many DQs to a SWL that may be present in shift-based repair implementations.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims. For example, AND gates may be replaced with NAND gates with opposite polarity of signals. Additionally or alternatively, inverters (e.g., inverting amplifiers) may be employed while maintaining the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
   a plurality of memory banks; and
   repair circuitry configured to remap data from the plurality of memory banks to repair memory elements of the plurality of memory banks when a failure occurs, wherein the repair circuitry comprises:
   a logic gate configured to:
      receive an output from a memory bank of the plurality of memory banks;
      receive a failure signal indicating whether a corresponding memory element of the plurality of memory banks has failed, wherein the logic gate is configured to zero out the output when the failure signal indicates that the memory element has failed; and
      transmit the output, wherein a value of the output is based at least in part on the failure signal;
   error correction circuitry configured to receive the output via the logic gate; and
   a multiplexer configured to:
      receive the output from the memory bank;
      receive a repair value; and
      selectively output the output or the repair value from the repair circuitry as an output of the repair circuitry, wherein the zeroing out of the output occurs before transmission to the error correction circuitry without changing the output transmitted to the multiplexer.

2. The electronic device of claim 1, wherein the error correction circuitry is configured to detect whether data from the plurality of memory banks contains errors before or during the multiplexer selectively outputting the output or the repair value.

3. The electronic device of claim 1, wherein the repair circuitry comprises a repair logic gate configured to zero out the repair value before transmission to the error correction circuitry without changing the repair value transmitted to the multiplexer.

4. The electronic device of claim 3, wherein the repair logic gate comprises an AND gate that is configured to receive the repair value and a repair signal indicating whether a repair is to be performed for any of the plurality of memory banks, and wherein the AND gate is configured to zero out the repair value based at least in part on the repair signal.

5. The electronic device of claim 4, wherein the memory element comprises a column plane of a memory bank of the plurality of memory banks.

6. The electronic device of claim 5, wherein the repair value is received from a global column plane, and wherein the repair signal indicates that any column plane of the memory bank has failed while the failure signal indicates a failure state of a particular column plane.

7. The electronic device of claim 1, wherein the logic gate comprises an AND gate.

8. The electronic device of claim 1, comprising a data sense amplifier configured to receive an indication of the output from a memory bank of the plurality of memory banks and to transmit the output to the logic gate and to the multiplexer.

9. The electronic device of claim 8, wherein the data sense amplifier is configured to transmit the output to the logic gate and to the multiplexer concurrently.

10. Repair circuitry for a memory device, comprising:
    a plurality of logic gates each configured to:
       receive a respective output from a respective amplifier of a plurality of amplifiers;
       receive a respective failure signal indicating whether a corresponding memory element is to be repaired; and
       selectively transmit the respective output or a default value to electronic correction circuitry based at least in part on the respective failure signal, wherein the default value comprises all zeros that is formed based at least in part on the respective failure signal; and
    a plurality of multiplexers each configured to:
       receive the respective output from the respective amplifier;
       receive a repair value; and
       selectively output the repair value or the respective output on a respective data line of a plurality of data lines.

11. The repair circuitry of claim 10, wherein receiving the respective output from the respective amplifier of a plurality of amplifiers comprises receiving the respective output from a respective data sense amplifier of a plurality of data sense amplifiers.

12. The repair circuitry of claim 10, wherein the corresponding memory elements comprise respective column planes of the memory device.

13. The repair circuitry of claim 12, wherein the repair value is received from a global column plane used as redundant storage to be used in a repair of a failing column plane.

14. The repair circuitry of claim 10, wherein the logic gate comprises an AND gate.

15. The repair circuitry of claim 10, wherein each of the plurality of multiplexers is configured to receive the respective failure signal and to perform the selective outputting based at least in part on the respective failure signal.

16. A method, comprising:
  receiving, at a logic gate, an output of a data sense amplifier from the data sense amplifier;
  receiving, at the logic gate, an indication of whether a column plane of a memory bank is repaired;
  selectively transmitting, from the logic gate, the output or a default value to error correction circuitry based at least in part on the indication;
  via the logic gate, zeroing out the output of the data sense amplifier to generate the default value;
  determining, in the error correction circuitry, whether a bit error exists in the output;
  receiving, at a multiplexer, the output of the data sense amplifier from the data sense amplifier;
  receiving, at the multiplexer, a repair value;
  receiving, at the multiplexer, the indication; and
  based on the indication, selectively outputting the output of the data sense amplifier or the repair value, wherein at least a portion of the determining is performed before selectively outputting is completed.

17. The method of claim 16, wherein at least a portion of the determining is performed concurrently with selection of the output of the data sense amplifier or the repair value.

18. The electronic device of claim 1, wherein the error correction circuitry is configured to detect whether data from the plurality of memory banks contains errors at least partially simultaneously with the multiplexer selecting the output or repair value.

19. The repair circuitry of claim 10, comprising error correction circuitry configured to determine whether data from the plurality of amplifiers contains errors at least partially simultaneously with the plurality of multiplexers selecting the repair value of the respective output.

* * * * *